United States Patent
Chang et al.

(10) Patent No.: US 7,190,033 B2
(45) Date of Patent: Mar. 13, 2007

(54) CMOS DEVICE AND METHOD OF MANUFACTURE

(75) Inventors: Sun-Jay Chang, Taitung County (TW); Chien-Li Cheng, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 15 days.

(21) Appl. No.: 10/826,956

(22) Filed: Apr. 15, 2004

(65) Prior Publication Data

US 2005/0230756 A1    Oct. 20, 2005

(51) Int. Cl.
*H01L 29/76* (2006.01)

(52) U.S. Cl. .................. 257/371; 257/635; 257/639; 257/640

(58) Field of Classification Search ............... 257/371, 257/351, 389, 639, 640, 638, 635
See application file for complete search history.

(56) References Cited

U.S. PATENT DOCUMENTS

| | | | | |
|---|---|---|---|---|
| 5,329,138 A * | 7/1994 | Mitani et al. | ............ | 257/42 |
| 5,471,085 A * | 11/1995 | Ishigaki et al. | ............ | 257/370 |
| 6,945,838 B2 * | 9/2005 | Konishi et al. | ............ | 445/5 |
| 7,109,568 B2 * | 9/2006 | Kumagai et al. | ............ | 257/627 |
| 7,115,449 B2 * | 10/2006 | Yeh et al. | ............ | 438/149 |
| 7,118,942 B1 * | 10/2006 | Li | ............ | 438/142 |

OTHER PUBLICATIONS

American Heritage Dictionary, Second College Edition, 1982, p. 1223.*
Hawley's Condensed Chemical Dictionary, Eleventh Edition, 1987, p. 1112.*

* cited by examiner

*Primary Examiner*—Sara Crane
(74) *Attorney, Agent, or Firm*—Slater & Matsil, L.L.P.

(57) ABSTRACT

A CMOS device and manufacturing method thereof wherein a bilayer etch stop is used over a PMOS transistor, and a single etch stop layer is used for an NMOS transistor, for forming contacts to the source or drain of the CMOS device. A surface tension-reducing layer is disposed between the source or drain region of the PMOS transistor and an overlying surface tension-inducing layer. The surface tension-inducing layer may comprise a nitride material or carbon-containing material, and the surface tension-reducing layer may comprise an oxide material. Degradation of hole mobility in the PMOS transistor is prevented by the use of the surface tension-reducing layer of the bilayer etch stop.

23 Claims, 3 Drawing Sheets

CMOS DEVICE AND METHOD OF MANUFACTURE

TECHNICAL FIELD

The present invention relates generally to the manufacturing of semiconductor devices, and more particularly to a structure for and a method of manufacturing a complimentary metal oxide semiconductor (CMOS) device.

BACKGROUND

Semiconductor devices are used in a variety of electronic applications, such as personal computers, cell phones, digital cameras, and other electronic equipment, as examples. Semiconductor devices are typically fabricated by sequentially depositing insulating (or dielectric) layers, conductive layers and semiconductive layers of material over a semiconductor substrate, and patterning the various layers using lithography to form circuit components and elements thereon.

A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET).

Early MOS processes used one type of doping to create either positive or negative channel transistors. More recent designs, referred to as complimentary MOS (CMOS) devices, use both positive and negative channel devices in complimentary configurations. While this requires more manufacturing steps and more transistors, CMOS devices are advantageous because they utilize less power, and the devices may be made smaller and faster.

A nitride layer is an insulator that is often used in semiconductor device manufacturing as an etch stop layer. A nitride, such as silicon nitride ($Si_xN_y$) typically etches at a lower etching rate than silicon dioxide ($SiO_2$). Therefore, nitride materials are often used as etch stop layers to protect underlying semiconductor layers in an etch process. A nitride material layer may also be used as an endpoint detector, to indicate when an entire thickness of silicon dioxide has been etched away or removed. A different etch chemistry may then be used to remove the nitride layer. Using a nitride layer as an etch stop is advantageous in that an endpoint in the etch process can easily be determined by analyzing the by-products of the etch process, and damage to underlying material layers can be avoided.

However, in some applications, it may be undesirable to place a nitride layer or film directly over an underlying material layer. For example, depositing a tensile nitride material directly over a portion of a p channel MOS (PMOS) FET device may result in degradation of hole mobility, resulting in decreased performance of the P-type transistor.

Therefore, what is needed in the art is an etch stop material and method wherein the hole mobility of PMOS devices and other nitride-sensitive semiconductor applications is not degraded.

SUMMARY OF THE INVENTION

These and other problems are generally solved or circumvented, and technical advantages are generally achieved, by preferred embodiments of the present invention, in which a bilayer of an oxide and a tensile nitride or carbon-containing material is used as an etch stop layer over a PMOS device of a CMOS device. The oxide layer is deposited over both the NMOS device and the PMOS device. The oxide layer is removed from over the n channel MOS (NMOS) device, and a tensile nitride layer or carbon-containing material is deposited over the oxide layer and the NMOS device. The tensile nitride layer or carbon-containing material enhances the surface tension of an underlying source or drain of both the NMOS device and the PMOS device, and also enhances electron mobility. The oxide layer disposed between the source or drain of the PMOS device and the nitride or carbon-containing etch stop layer prevents the degradation of hole mobility for the PMOS device. The bilayer of oxide and nitride or carbon-containing material, and the nitride layer or carbon-containing material may be used as etch stop layers when contacts are subsequently formed in an inter-level dielectric (ILD) in order to make electrical contact to the sources or the drains of the PMOS and NMOS devices, respectively.

In accordance with a preferred embodiment of the present invention, a semiconductor device includes a workpiece, a first transistor being formed in a first region of the workpiece, the first transistor having a first source, a first drain, and a first gate, and a second transistor being formed in a second region of the workpiece, the second transistor having a second source, a second drain, and a second gate. A first insulating layer is disposed over at least the second source or the second drain of the second transistor. A second insulating layer is disposed over at least the first source or the first drain of the first transistor and over the first insulating layer over the second source or the second drain of the second transistor. The second insulating layer comprises a different material than the first insulating layer.

In accordance with another preferred embodiment of the present invention, a CMOS device includes a workpiece, and a first transistor formed in a first region of the workpiece, the first transistor comprising an n channel metal oxide semiconductor transistor (NMOS) device, the first transistor having a first source, a first drain, and a first gate. A second transistor is formed in a second region of the workpiece, the second transistor comprising a p channel metal oxide semiconductor transistor (PMOS) device, the second transistor having a second source, a second drain, and a second gate. A surface tension-reducing layer is disposed over at least the second source or the second drain of the second transistor, and a surface tension-inducing layer is disposed over at least the first source or the first drain of the first transistor and over the surface tension-reducing layer over the second source or the second drain of the second transistor. The surface tension-inducing layer comprises a different material than the surface tension-reducing layer. An ILD layer is disposed over the first transistor and the second transistor, and a first contact is formed within the ILD layer, the first contact making electrical contact to the first source or the first drain of the first transistor. A second contact is formed within the ILD layer, the second contact making electrical contact to the second source or the second drain of the second transistor.

In accordance with yet another preferred embodiment of the present invention, a method of manufacturing a semiconductor device includes providing a workpiece, forming a first transistor in a first region of the workpiece, the first transistor having a first source, a first drain, and a first gate, and forming a second transistor in a second region of the workpiece, the second transistor having a second source, a second drain, and a second gate. A first insulating layer is formed over at least the second source or the second drain of the second transistor. A second insulating layer is formed over at least the first source or the first drain of the first transistor and over the first insulating layer over the second source or the second drain of the second transistor, wherein forming the second insulating layer comprises forming a different material than the first insulating layer.

Advantages of embodiments of the present invention include providing a nitride etch stop layer over an NMOS device and a bilayer etch stop including an oxide layer and a nitride layer over a PMOS device, which enhances CMOS device performance by creating surface tension to the channels of the NMOS and PMOS devices. The oxide layer reduces stress and surface tension for the source or drain and prevents the degradation of the hole mobility of the PMOS device. The negative bias temperature instability and hot carrier effect of the CMOS device are improved by the use of the bilayer etch stop over the PMOS device.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of embodiments of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
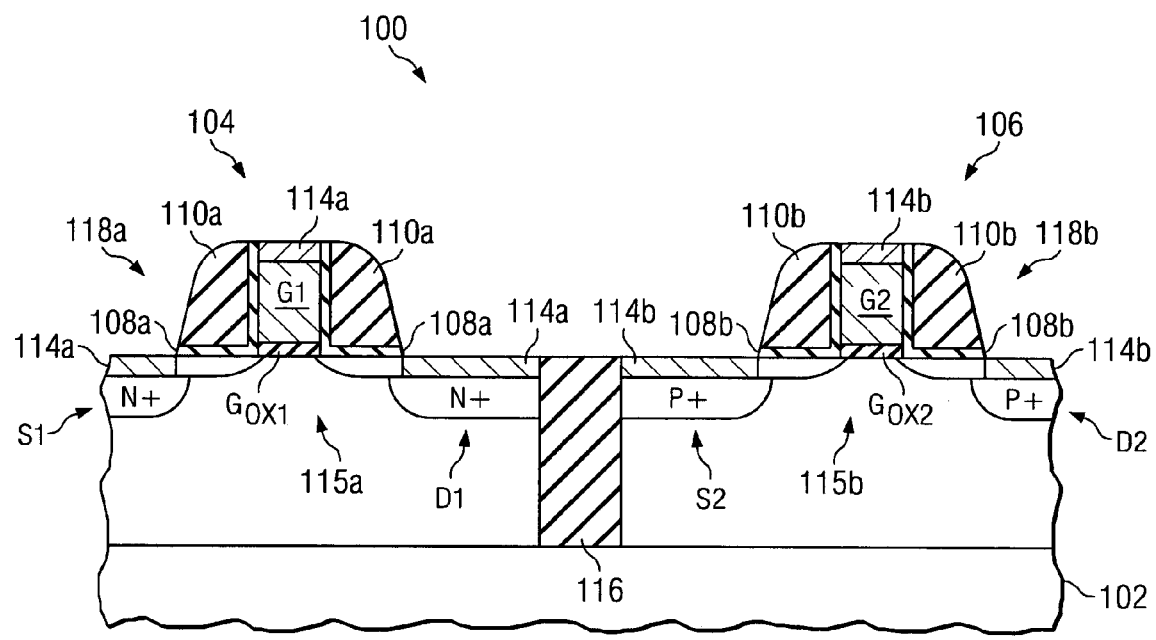
FIGS. 1 through 5 show cross-sectional views of a semiconductor device at various stages of manufacturing in accordance with a preferred embodiment of the present invention, wherein an etch stop layer comprising a bilayer of oxide and nitride is formed over a PMOSFET of a CMOS device before contacts are formed in an ILD layer.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a CMOS device. Embodiments of the invention may also be applied, however, to other semiconductor device applications where it may be undesirable to deposit a nitride film or layer as an etch stop material directly over an underlying material layer. Note that in the drawings shown, only one PMOS device and one NMOS device are shown; however, there may be many PMOS and NMOS devices formed during each of the manufacturing processes described herein.

FIGS. 1 through 5 show cross-sectional views of a semiconductor device at various stages of manufacturing in accordance with a preferred embodiment of the present invention. With reference now to FIG. 1, there is shown a semiconductor device 100 in a cross-sectional view having a workpiece 102. The semiconductor device 100 preferably comprises a CMOS device including an NMOSFET and a PMOSFET, to be described further herein. The semiconductor device may alternatively comprise other semiconductor devices, for example.

The workpiece 102 may include a semiconductor substrate comprising silicon or other semiconductor materials covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may also comprise a silicon-on-insulator (SOI) substrate.

The workpiece 102 includes a first region 104 and a second region 106. The first region 104 comprises a region where a first transistor 118a comprising an NMOS device or NMOSFET, as examples, will be formed. The second comprises a region where a second transistor 118b comprising a PMOS device or PMOSFET will be formed, as examples. The first region 104 and the second region 106 may be separated by shallow trench isolation (STI) region 116, as shown.

A first transistor 118a is formed in the first region 104 of the workpiece 102. The first transistor 118a preferably comprises an NMOS device or NMOSFET, in one embodiment. The first transistor 118a includes a first source S1, a first drain D1, and a first gate G1 separated from a first channel region 115a by a gate oxide $G_{ox1}$. The first channel region 115a comprises an n channel in one embodiment. The first source S1 and the first drain D1 may be formed by implanting ions of a dopant to form an n+ region, as shown. The first transistor 118a may include a thin insulator 108a disposed over exposed portions of the channel region 115a and over the sidewalls of the gate G1, as shown. A spacer 110a may be formed on either side of the gate G1. The thin insulator 108a may comprise an oxide, and the spacers 110a may comprise a nitride, although alternatively, other materials may be used for the thin insulator 108a and the spacers 110a, for example. The first source S1, the first drain D1, and the first gate G1 may include a silicide material 114a formed at a top surface thereof (often referred to as a salicide because the formation of the silicide may be self-aligning). The silicide 114a may comprise about 100 Å to 300 Å of $CoSi_2$ or NiSi, although the silicide 114a may alternatively comprise other materials and thicknesses, as examples. The silicide 114a reduces the sheet resistance of the materials of the source S1, drain D1 and gate G1 that the silicide 114a is formed on.

The semiconductor device 100 comprises a second transistor 118b formed in the second region 106, as shown. The second transistor 118b includes a second source S2, a second drain D2, and a second gate G2 that is separated from a channel region 115b by a gate oxide $G_{ox2}$. The second channel region 115b comprises a p channel in one embodiment. Preferably, in one embodiment, the second transistor 118b is a PMOS device or PMOSFET, and comprises a second source S2 and a second drain D2 comprising a p+ type material, as shown. The second source S2 and second drain D2 may be formed by ion implantation, for example. As in the first transistor 118a, the second transistor 118b may also comprise a thin insulator 108b and a spacer 110b disposed over the thin insulator 108b. A silicide 114b may be formed over the top surface of the second source S2, the second drain D2, and the second gate G2, as shown.

Figure 2:
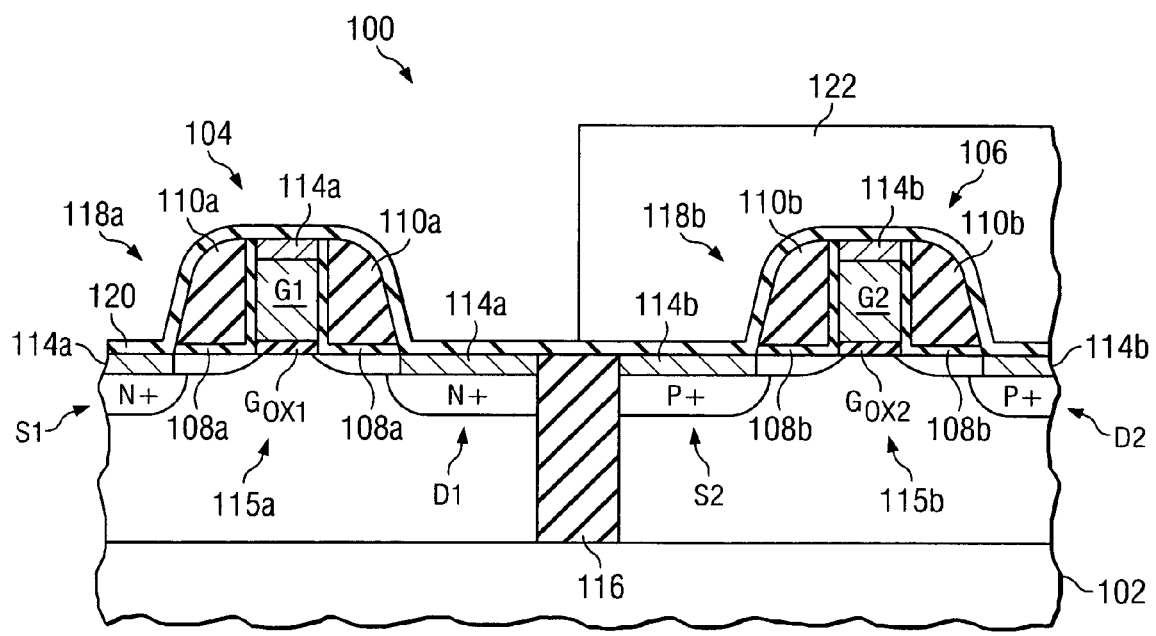

Referring now to FIG. 2, in accordance with a preferred embodiment of the present invention, a first insulating layer 120 is deposited over the first transistor 118a and the second transistor 118b after the formation of the first transistor 118a and the second transistor 118b. The first insulating layer 120 preferably comprises a thickness of about 400 Å or less, and more preferably comprises a thickness of about 50 Å to 300 Å, in one embodiment. The first insulating layer 120 preferably comprises silicon dioxide ($SiO_2$) or silicon oxynitride (SiON), as examples, although alternatively, the first insulating layer 120 may comprise other materials, for example. The first insulating layer 120 may be formed by chemical vapor deposition (CVD), physical vapor deposition (PVD), or atomic layer deposition (ALD), as examples, although alternatively, the first insulating layer 120 may be deposited by other methods, for example. The first insulating layer 120 preferably comprises a material that does not increase or induce surface tension on a top surface of the source or drain region S2 or D2 of the second transistor 118b. In particular, the first insulating layer 120, in one embodiment, preferably comprises a material that reduces an increase in surface tension that may be caused to the source S2 and drain D2 of the PMOS device 118b by a subsequently-deposited second insulating layer 124, (e.g., without the presence of the first insulating layer 120), (shown in FIG. 3), to be described further herein. The first insulating layer 120 is also referred to herein as a surface tension-reducing layer 120.

Figure 3:
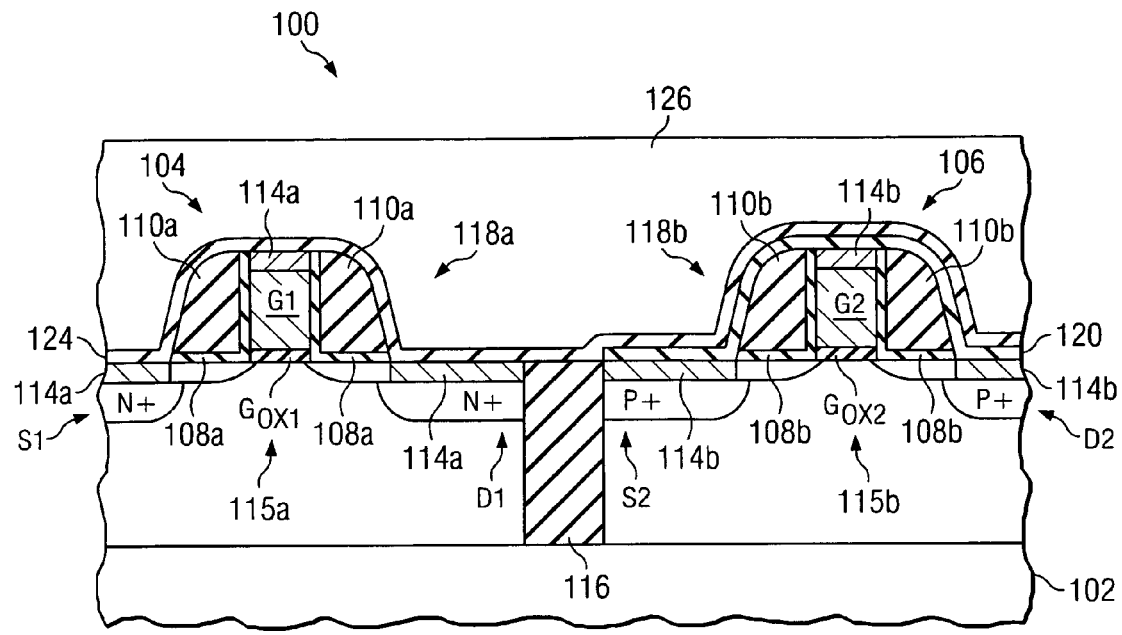

Referring again to FIG. 2, the first insulating layer 120 is then removed from over the first transistor 118a in the first region 104. This may be accomplished using lithography techniques, or alternatively, the first insulating layer 120 may be removed from over the first transistor 118a using other methods. For example, a first photoresist layer 122 may be deposited over the top material layers of the workpiece; in particular, over the first insulating layer 120, as shown in FIG. 2. The first photoresist layer 122 may then be patterned, using a lithography mask or by direct patterning, and portions of the photoresist 122 may be removed from the first region 104 of the workpiece 102, leaving the photoresist 122 remaining over the second transistor 118b in the second region 106 of the workpiece 102, as shown in FIG. 2. While the photoresist layer 122 is left remaining over the second region 106, the first region 104 of the workpiece 102 is exposed to an etch process to remove the first insulating layer 120 from over the first transistor 118a in the first region 104, as shown in FIG. 3. The first photoresist layer 122 is then removed from over the second transistor 118b.

In accordance with preferred embodiments of the present invention, a second insulating layer 124 is then deposited over the first insulating layer 120 in the second region 106 of the workpiece 102 and also directly over the first transistor 118a in the first region 104 of the workpiece 102, as shown in FIG. 3. The second insulating layer 124 preferably comprises a material different from the first insulating layer 120 material, and in one embodiment, the second insulating layer 124 comprises a nitride material or a carbon-containing material. As examples, the second insulating layer 124 may comprise silicon nitride ($Si_xN_y$) or silicon-carbon (SiC), although alternatively, other materials may be used for the second insulating layer 124. The second insulating layer 124 preferably comprises a thickness of about 850 Å or less, and more preferably comprises a thickness of about 200 Å to about 700 Å, as examples. Also, preferably, a subsequently deposited ILD layer 126 comprises a material that may be etched selective to the material of the second insulating layer 124, to be described further herein. The second insulating layer 124 functions as a stress release buffer layer, and is also referred to herein as a stress-inducing layer 124 or a tensile nitride layer 124.

The second insulating layer 124 also preferably comprises a material that is surface tension-inducing to the underlying first source S1 and first drain D1 of the first transistor 118a. The stressed first source S1 and first drain D1 creates tensile stress to the first channel region 115a of the first transistor 118a. This is advantageous in that the mobility of electrons and holes in the first transistor 118a is improved by the presence of the second insulating layer 124.

In the second transistor 118b having P+ second source S1 and second drain D2, without the presence of the first insulating layer 120, the tensile stress from the second insulating layer 124 would enhance the electron mobility, yet degrade the hole mobility in the second channel region 115b. The first insulating layer 120 comprising an oxide acts as a buffer layer to absorb the tensile stress from the second insulating layer 124, preventing excessive tensile stress caused by the second insulating layer 124 from being introduced to the second source S2 and second drain D2, thus reducing the tensile stress in the second channel region 115b, and preventing the degradation of hole mobility in the second channel region 115b of the PMOSFET 118b. Because the first insulating layer 120 comprises a surface tension-reducing material, the increase in the surface tension of the second transistor source S2, drain D2 and channel region 115b caused by the second insulating layer 124 is reduced by the first insulating layer 120 in the second region 106.

An ILD layer 126 is then deposited over the first transistor 118a and the second transistor 118b, as shown in FIG. 3. The ILD layer 126 preferably comprises silicon dioxide, although alternatively, the ILD 126 may comprise other dielectric and insulating layers typically used in semiconductor device manufacturing. For example, the ILD layer 126 may comprise low dielectric constant materials, more traditional dielectric materials, or combinations thereof. However, in accordance with embodiments of the present invention, the ILD layer 126 material preferably comprises a material that may be etched selective to the second insulating layer 124.

Figure 4:
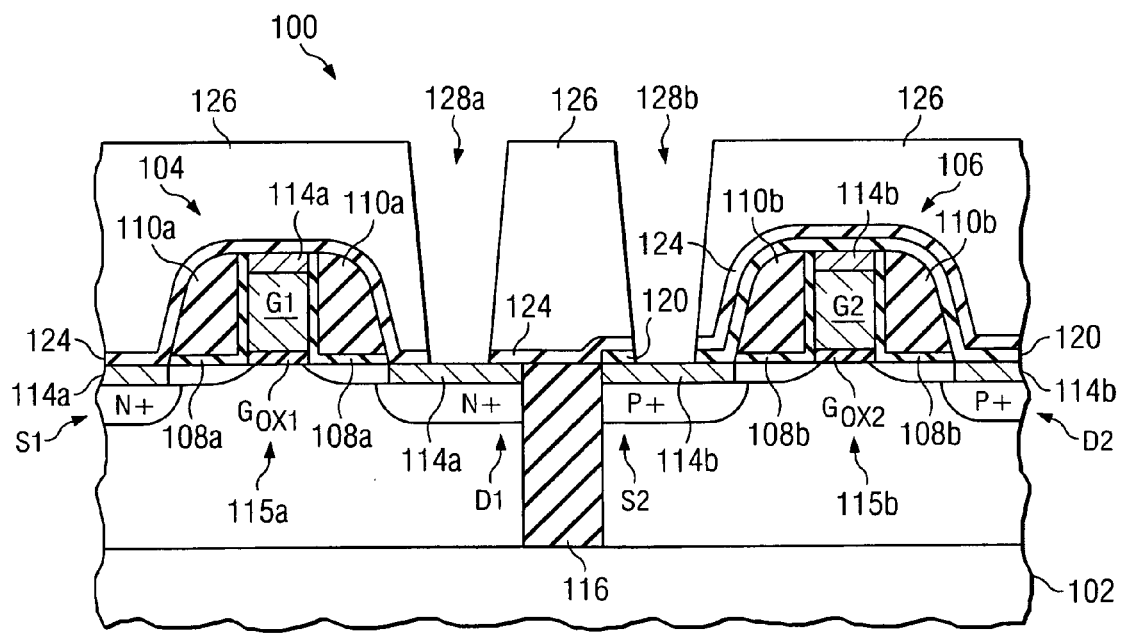

The ILD layer 126, the first insulating layer 120 and the second insulating layer 124 are then patterned and etched to form a first trench 128a for a first contact and a second trench 128b for a second contact, as shown in FIG. 4. The ILD layer 126 may be patterned using traditional lithography techniques, for example. A second photoresist layer, not shown, may be deposited over the ILD layer 126, and the second photoresist layer may be patterned using a lithography mask or a direct patterning method. The pattern from the second photoresist layer is then transferred to the ILD layer 126. For example, the ILD layer 126 may be etched using the second photoresist layer as a mask, similar to the description of the patterning of the first insulating layer 120 by the first photoresist layer 122 with reference to FIG. 2.

The first trench 128a exposes a top surface of the first source S1 or the first drain D1 of the first transistor 118a. If a silicide 114a is formed over the first source S1 or first drain D1, then the first trench 128a leaves the silicide region 114a over the first source S1 or the first drain D1 exposed. Similarly, the second trench 128b exposes a top surface of the second source S2 or the second drain D2 of the second transistor 118b, or more particularly, exposes the silicide region 114b over the second source S2 or the second drain D2, as shown. A trench 128a or 128b may be formed over the source S1/S2, drain D1/D2, or both the source S1/S2 and drain D1/D2, not shown.

Figure 5:
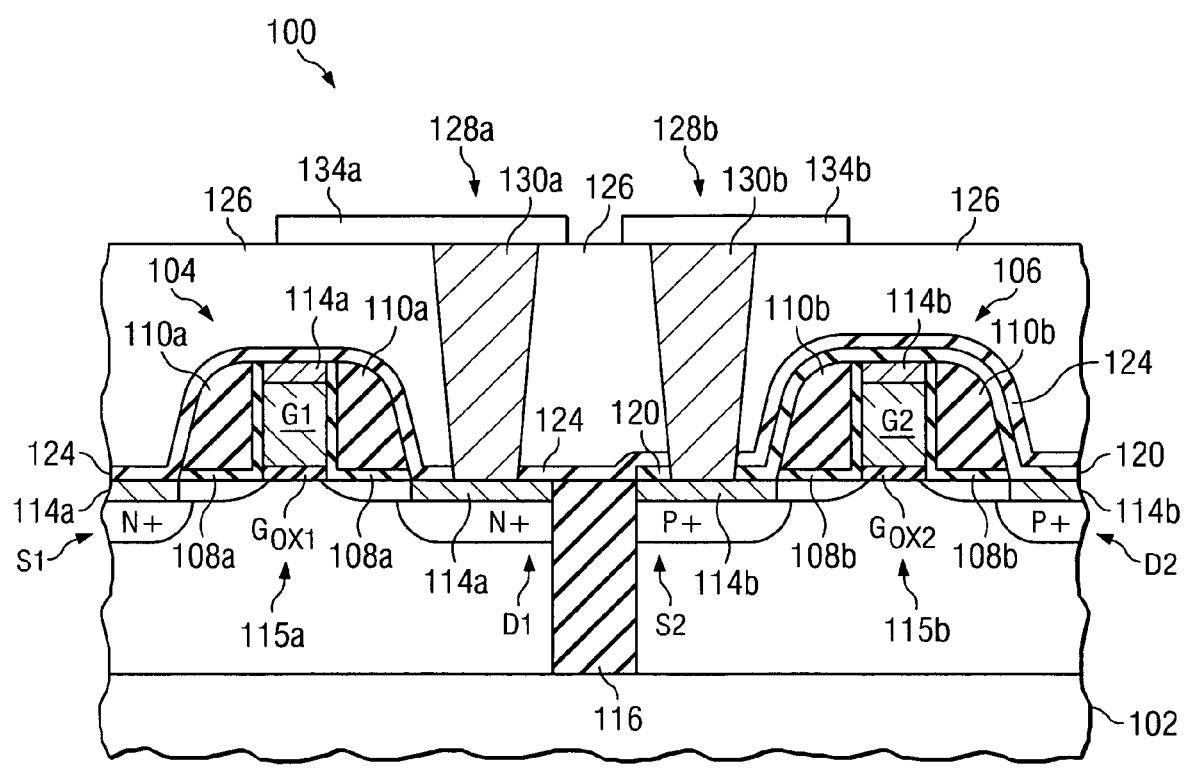

A conductive material such as tungsten (W) is deposited over the ILD layer 126 to fill the first trench 128a and the second trench 128b, as shown in FIG. 5. If necessary, any excess conductive material residing over the top surface of the ILD layer 126 may be removed, for example, using a chemical-mechanical polish (CMP) process. The conductive material fills the first trench 128a to form a first contact 130a that makes electrical contact to the first source S1 or the first drain D1 of the first transistor 118a, as shown. Similarly, the conductive material forms a second contact 130b that makes electrical contact to the second source S2 or the second drain D2 of the second transistor 118b. The first contact 130a and the second contact 130b may comprise other conductive materials, for example. A contact 130a or 130b may be formed over the source S1/S2, drain D1/D2, or both the source S1/S2 and drain D1/D2, not shown.

Preferably, in one embodiment, the second insulating layer 124 functions as an etch stop during the patterning of the ILD layer 126 to form the first trench 128a, and the second insulating layer 124 and first insulating layer 120 function as an etch stop during the patterning of the ILD layer 126 to form the second trench 128b. Note that in the second region 106 of the workpiece 102, the etch stop layer includes both the first insulating layer 120 and the second insulating layer 124. Advantageously, the first insulating layer 120 prevents the second insulating material 124, which preferably comprises a nitride in one embodiment, from coming into direct contact with the second source region S2 and/or the second drain region D2 of the second transistor 118b. This is advantageous because degradation of the performance of the second transistor 118b is prevented and/or eliminated. In particular, the first insulating layer 120 reduces the surface tension of the source S2, drain D2 and channel region 115b of the second transistor 118b, which comprises a PMOS device in one embodiment.

After the first contact 130a and the second contact 130b are formed, making electrical contact to desired regions S1, D1 or S2, D2 of the underlying first transistor 118a and the second transistor 118b, respectively, subsequent manufacturing processes may then be performed on the workpiece 102 in order to complete the fabrication of the semiconductor device 100. For example, additional metallization and insulating layers may be formed and patterned over the top surface of the ILD layer 126 and contacts 130a and 130b. A passivation layer may be deposited over the ILD layer 126 and the first transistor 118a and second transistor 118b, not shown. A first bond pad 134a and a second bond pad 134b may be formed over first contact 130a and second contact 130b, respectively, as shown in FIG. 5. The first bond pad 134a and the second bond pad 134b may comprise aluminum or other metals, as examples. The individual die of the semiconductor device 100 may then be singulated or separated, and the bond pads 134a and 134b may be connected to leads of an integrated circuit package (not shown) in order to provide electrical contact to the transistors 118a and 118b of the semiconductor device 100.

Advantages of embodiments of the present invention include providing a nitride etch stop layer 124 over an NMOS device 118a and an etch stop bilayer of an oxide 120 and a nitride 124 over a PMOS device 118b, which enhances device performance by creating surface tension to the channel 115a and 115b of the NMOS 118a and PMOS 118b devices. The first insulating layer 120 reduces stress and surface tension in the channel region 115b of the PMOS device 118b, which prevents the degradation of the hole mobility of the PMOS transistor 118b. The negative bias temperature instability and hot carrier effect of the CMOS device 100 are improved by the use of the surface tension-reducing first insulating layer 120 beneath the surface tension-inducing second insulating layer 124 over the PMOS device 118b.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
   a workpiece;
   a first transistor formed in a first region of the workpiece, the first transistor having a first source, a first drain, and a first gate;
   a second transistor formed in a second region of the workpiece, the second transistor having a second source, a second drain, and a second gate;
   a first insulating layer disposed over at least the second source or the second drain of the second transistor; and
   a second insulating layer disposed over at least the first source or the first drain of the first transistor and over the first insulating layer over the second source or the second drain of the second transistor, the second insulating layer comprising a different material than the first insulating layer, wherein the second insulating layer increases surface tension of a top surface of the first source or the first drain of the first transistor, and wherein the first insulating layer comprises a material that reduces surface tension of a top surface of the second source or the second drain of the second transistor.

2. The semiconductor device according to claim 1, wherein the first transistor comprises a first channel region disposed beneath the first gate, wherein the second transistor comprises a second channel region disposed beneath the second gate, wherein the second insulating layer increases surface tension in the first channel region of the first transistor, and wherein the first insulating layer reduces surface tension in the second channel region of the second transistor.

3. The semiconductor device according to claim 1, wherein the first insulating layer comprises an oxide material and the second insulating layer comprises a nitride material or a carbon-containing material.

4. The semiconductor device according to claim 3, wherein the first insulating layer comprises silicon dioxide or silicon oxynitride, and the second insulating layer comprises silicon nitride or silicon-carbon.

5. The semiconductor device according to claim 3, wherein the first insulating layer comprises a thickness of about 400 Å or less, and wherein the second insulating layer comprises a thickness of about 850 Å or less.

6. The semiconductor device according to claim 1, further comprising:
   en interlevel dielectric (ILD) layer disposed over the first transistor and the second transistor;
   a first contact formed within the ILD layer, the first contact making electrical contact to the first source or the first drain of the first transistor; and
   a second contact formed within the ILD layer, the second contact making electrical contact to the second source or the second drain of the second transistor.

7. The semiconductor device according to claim 6, wherein the ILD layer comprises a material etchable selective to the material of the second insulating layer.

8. The semiconductor device according to claim 6, wherein the ILD layer comprises an oxide material, and wherein the second insulating layer comprises a nitride material or carbon-containing material.

9. The semiconductor device according to claim 6, further comprising a first bond pad disposed over the first contact, and a second bond pad disposed over the second contact.

10. The semiconductor device according to claim 1, wherein the first region of the workpiece is proximate the second region of the workpiece, wherein the semiconductor device comprises a complimentary metal oxide semiconductor (CMOS) device, wherein the first transistor comprises an n channel metal oxide semiconductor transistor (NMOS) device, and wherein the second transistor comprises a p channel metal oxide semiconductor transistor (PMOS) device.

11. The semiconductor device according to claim 10, wherein the first source and the first drain of the first transistor are N+ doped, and wherein the second source and the second drain of the second transistor are P+ doped.

12. The semiconductor device according to claim 1, further comprising a silicide layer disposed over the first source, the first drain, and the first gate of the first transistor, and over the second source, the second drain, and the second gate of the second transistor.

13. A complimentary metal oxide semiconductor (CMOS) device, the CMOS device comprising:
    a workpiece;
    a first transistor formed in a first region of the workpiece, the first transistor comprising an n channel metal oxide semiconductor transistor (NMOS) device, the first transistor having a first source, a first drain, and a first gate;
    a second transistor formed in a second region of the workpiece, the second transistor comprising a p channel metal oxide semiconductor transistor (PMOS) device, the second transistor having a second source, a second drain, and a second gate;
    a surface tension-reducing layer disposed over at least,the first source or the first drain of the first transistor;
    a surface tension-inducing layer disposed over at least the first source or the first drain of the first transistor and over the surface tension-reducing layer over the second source or the second drain of the second transistor, the surface tension-inducing layer comprising a different material than the surface tension-reducing layer;
    an interlevel dielectric (ILD) layer disposed over the first transistor and the second transistor;
    a first contact formed within the ILD layer, the first contact making electrical contact to the first source or the first drain of the first transistor; and
    a second contact formed within the ILD layer, the second contact making electrical contact to the second source or the second drain of the second transistor.

14. The semiconductor device according to claim 13, wherein the surface tension-inducing layer increases surface tension of a top surface of the first source or the first drain of the first transistor, and wherein the surface tension-reducing layer comprises a material that reduces surface tension of a top surface of the second source or the second drain of the second transistor.

15. The semiconductor device according to claim 14, wherein the first transistor comprises a first channel region disposed beneath the first gate, wherein the second transistor comprises a second channel region disposed beneath the second gate, wherein the surface tension-inducing layer increases surface tension in the first channel region of the first transistor, and wherein the surface tension-reducing layer reduces surface tension in the second channel region of the second transistor.

16. The semiconductor device according to claim 13, wherein the surface tension-reducing layer comprises an oxide material and the surface tension-inducing layer comprises a nitride material or a carbon-containing material.

17. The semiconductor device according to claim 16, wherein the surface tension-reducing layer comprises silicon dioxide or silicon oxynitride, and the surface tension-inducing layer comprises silicon nitride or silicon-carbon.

18. The semiconductor device according to claim 13, wherein the surface tension-reducing layer comprises a thickness of about 50 Å to about 300 Å, and wherein the surface tension-inducing layer comprises a thickness of about 200 Å to about 700 Å.

19. The semiconductor device according to claim 13, wherein the ILD layer comprises a material that is etchable selective to the material of the surface tension-inducing layer.

20. The semiconductor device according to claim 19, wherein the ILD layer comprises an oxide material, and wherein the surface tension-inducing layer comprises a nitride material or a carbon-containing material.

21. The semiconductor device according to claim 13, wherein the first source and the first drain of the first transistor are N+ doped, and wherein the second source and the second drain of the second transistor are P+ doped.

22. The semiconductor device according to claim 13, further comprising a silicide layer disposed over the first source, the first drain, and the first gate of the first transistor, and disposed over the second source, the second drain, and the second gate of the second transistor.

23. The semiconductor device according to claim 13, further comprising a first bond pad disposed over the first contact and a second bond pad disposed over the second contact.

* * * * *

UNITED STATES PATENT AND TRADEMARK OFFICE
CERTIFICATE OF CORRECTION

| | |
|---|---|
| PATENT NO. | : 7,190,033 B2 |
| APPLICATION NO. | : 10/826956 |
| DATED | : March 13, 2007 |
| INVENTOR(S) | : Chang et al. |

It is certified that error appears in the above-identified patent and that said Letters Patent is hereby corrected as shown below:

Column 9, line 15; delete "en" insert --an--

Signed and Sealed this

Eighth Day of May, 2007

JON W. DUDAS
*Director of the United States Patent and Trademark Office*